United States Patent
Anemikos et al.

(10) Patent No.: US 9,310,426 B2
(45) Date of Patent: Apr. 12, 2016

(54) ON-GOING RELIABILITY MONITORING OF INTEGRATED CIRCUIT CHIPS IN THE FIELD

(71) Applicant: International Business Machines Corporation, Armonk, NY (US)

(72) Inventors: Theodoros E. Anemikos, Milton, VT (US); Douglas S. Dewey, Highgate, VT (US); Pascal A. Nsame, Essex Junction, VT (US); Anthony D. Polson, Jericho, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 538 days.

(21) Appl. No.: 13/626,040

(22) Filed: Sep. 25, 2012

(65) Prior Publication Data

US 2014/0088947 A1     Mar. 27, 2014

(51) Int. Cl.
*G06G 7/54* (2006.01)
*G01R 31/28* (2006.01)
*G01R 31/30* (2006.01)
(Continued)

(52) U.S. Cl.
CPC ........ *G01R 31/2856* (2013.01); *G01R 31/3004* (2013.01); *G11C 29/06* (2013.01); *G11C 29/12005* (2013.01); *G01R 31/2872* (2013.01); *G01R 31/2894* (2013.01);
(Continued)

(58) Field of Classification Search
CPC ........... G01R 31/2856; G01R 31/2872; G01R 31/3004; G11C 29/12005
USPC .......................................................... 703/18
See application file for complete search history.

(56) References Cited

U.S. PATENT DOCUMENTS

| 5,424,988 A | 6/1995 | McClure et al. |
| 5,633,877 A | 5/1997 | Shephard, III et al. |

(Continued)

FOREIGN PATENT DOCUMENTS

| DE | 10110315 C2 | 12/2003 |
| JP | 06342040 A | 12/1994 |
| WO | 0208904 A2 | 1/2002 |

OTHER PUBLICATIONS

Kim, Tae-Hyoung, Randy Persaud, and Chris H. Kim. "Silicon odometer: An on-chip reliability monitor for measuring frequency degradation of digital circuits." Solid-State Circuits, IEEE Journal of 43.4 (2008): 874-880.*

(Continued)

*Primary Examiner* — Aniss Chad
(74) *Attorney, Agent, or Firm* — Gibb & Riley, LLC; David A. Cain, Esq.

(57) ABSTRACT

Disclosed is an integrated circuit (IC) chip with a built-in self-test (BIST) architecture that allows for in the field accelerated stress testing. The IC chip can comprise an embedded processor, which selectively alternates operation of an on-chip test block between a stress mode and a test mode whenever the IC chip is powered-on such that, during the stress mode, the test block operates at a higher voltage level than an on-chip functional block and such that, during the test mode, the test block operates at a same voltage level as the functional block and is subjected to testing. Also disclosed are a system, method and computer program product which access the results of such testing from IC chips in a variety of different types of products in order model IC chip performance degradation and to generate IC chip end of life predictions specific to the different types of products.

18 Claims, 5 Drawing Sheets

(51) Int. Cl.
   *G11C 29/06* (2006.01)
   *G11C 29/12* (2006.01)
   *G11C 11/412* (2006.01)
   *G11C 29/04* (2006.01)

(52) U.S. Cl.
   CPC ..... *G11C 11/412* (2013.01); *G11C 2029/0401* (2013.01); *G11C 2029/0409* (2013.01)

(56) References Cited

U.S. PATENT DOCUMENTS

| | | |
|---|---|---|
| 5,666,046 A | 9/1997 | Mietus |
| 5,835,427 A | 11/1998 | McClure |
| 5,917,766 A | 6/1999 | Tsuji et al. |
| 5,949,731 A * | 9/1999 | Tsukude ............... 365/230.01 |
| 6,005,815 A | 12/1999 | Nakano |
| 6,087,820 A | 7/2000 | Houghton et al. |
| 6,275,442 B1 | 8/2001 | Hill et al. |
| 6,684,353 B1 | 1/2004 | Parker et al. |
| 6,762,966 B1 | 7/2004 | LaRosa et al. |
| 6,894,937 B2 | 5/2005 | Garni et al. |
| 7,005,871 B1 | 2/2006 | Davies et al. |
| 7,073,112 B2 | 7/2006 | Chai et al. |
| 7,307,468 B1 | 12/2007 | Vasudevan |
| 7,839,155 B2 | 11/2010 | Butler |
| 2006/0267621 A1 * | 11/2006 | Harris et al. ............... 324/765 |
| 2008/0100328 A1 | 5/2008 | Dhong et al. |
| 2008/0301511 A1 | 12/2008 | Miller et al. |
| 2010/0271064 A1 | 10/2010 | Kohler et al. |
| 2011/0078506 A1 | 3/2011 | Graas et al. |
| 2011/0102005 A1 | 5/2011 | Feng et al. |
| 2012/0105240 A1 | 5/2012 | Bickford et al. |

OTHER PUBLICATIONS

IBM, "Timing Critical Path Based Digital Chip Aging Measurement," IP.com No. IPCOM000183721D, Jun. 1, 2009, 6 pages.

IBM, "Circuit for On-Chip Measurement of Change of ThresholdVoltage of Devices Due to Stress and Aging," IP.com No. IPCOM000193032D, Feb. 8, 2010, 4 pages.

IBM, "On-Chip Test Structure," IP.com No. IPCOIM000169987D, May 5, 2008, 5 pages.

Kim, et al., "Silicon Odometer: An On-Chip Reliability Monitor for Measuring Frequency Degradation of Digital Circuits," IEEE Journal of Solid-State Circuits, vol. 43, No. 4, Apr. 2008, pp. 874-880.

van Dijk, et al., "Validationg Foundry Technologies for Extended Mission Profiles," IEEE Explore, IRPS10-111, Jul. 29, 2010, pp. 2D.2.1-2D.2.6.

Graas, et al., U.S. Appl. No. 13/082,066, filed Apr. 7, 2011.

* cited by examiner

ON-GOING RELIABILITY MONITORING OF INTEGRATED CIRCUIT CHIPS IN THE FIELD

BACKGROUND

1. Field of the Invention

The disclosed embodiments relate to on-going reliability monitoring of integrated circuit (IC) chips and, more particularly, to an integrated circuit chip structure with a built-in self-test (BIST) circuit allowing for on-going reliability monitoring and, more specifically, allowing for in the field accelerated stress testing, the results of which can be used in system, method and computer program embodiments to generate IC chip performance degradation models and IC chip end of life predictions specific to different types of products.

2. Description of the Related Art

Various mechanisms associated with different classes of devices incorporated into integrated circuit (IC) chips can cause performance of the IC chips to degrade over time. Typically, in order to predict how IC chips in a given semiconductor technology will perform over time, all devices available in that given semiconductor technology are subjected to accelerated voltage and/or temperature stress tests in a laboratory environment at the wafer or module levels and/or in a test system environment. Then, based on the results of the accelerated stress testing, performance degradation models and end of life predictions for the IC chips in the given semiconductor technology are generated. Due to cost and time constraints such IC chip performance degradation models and IC chip end of life predictions are typically generated based on environmental assumptions (e.g., operating temperature, operating voltage, power-on-hours (POH), etc.) associated with only a selected sample of one or more products (e.g., for smart phones, tablet computers, etc.) that incorporate the IC chips. Then, the performance degradation models and end of life predictions are used across all products (i.e., applied to IC chips in the given semiconductor technology which are incorporated into any other products, such as laptop computers, desktop computers, servers, etc.).

Unfortunately, the environmental assumptions associated with the selected sample of products may be different then the actual environmental conditions in other products. For example, the operating temperature, operating voltage, power-on-hours (POH), etc. of IC chips may vary from product to product. Thus, the resulting IC chip performance degradation models and IC chip end of life predictions may not be applicable across all products. Therefore, it would be advantageous to be able to perform accelerated stress testing of all IC chips in a given semiconductor technology and to do so in the field on different types of products in order to eliminate any inaccurate environmental assumptions, thereby allowing for more accurate and continuously updated IC chip performance degradation models and IC chip end of life predictions that are specific to different types of products.

SUMMARY

In view of the foregoing, disclosed herein are embodiments of an integrated circuit (IC) chip structure with a built-in self-test (BIST) architecture that allows accelerated stress testing to be performed in the field in order to provide on-going reliability monitoring while eliminating or at least minimizing any inaccurate environmental assumptions. Specifically, the IC chip can comprise an embedded processor and, specifically, an on-chip BIST controller, which selectively alternates operation of an on-chip test block at regular predetermined intervals between a stress mode and a test mode whenever the integrated circuit chip is powered-on such that, during the stress mode, the test block operates at a higher voltage level than an on-chip functional block and such that, during the test mode, the test block operates at a same voltage level as the functional block and is subjected to both pass/fail and parametric testing. Also disclosed herein are embodiments of a system, method and computer program product which access the results of such testing from IC chips in a variety of different types of products in order to generate IC chip performance degradation models specific to the different types of products as well as to generate IC chip end of life predictions specific to the different types of products.

More particularly, disclosed herein are embodiments of an integrated circuit (IC) chip with a built-in self-test (BIST) architecture that allows accelerated stress testing to be performed in the field in order to eliminate any inaccurate environmental assumptions. This IC chip can comprise a functional block (e.g., a memory array circuit, a digital circuit, an analog circuit, etc.), which performs a functional operation on the on the IC chip when incorporated into a product. The IC chip can further comprise a test block. This test block can comprise a same type circuit as the functional block and, optionally, can be smaller than the functional block (i.e., can be made up of a lesser number of same type devices, such as memory cells, digital devices, or analog devices). The IC chip can further comprise an embedded processor and, specifically, a BIST controller that selectively alternates operation of the test block between a stress mode and a test mode whenever the integrated circuit (IC) chip is powered-on in the field (i.e., in a product). During the stress mode, the test block can operate at a higher voltage level than the functional block, whereas, during the test mode, the test block can operate at the same voltage level as the functional block and can be subjected to testing. The embedded processor can capture the results of such testing and can be remote access service (RAS) enabled so as to allow those results to be reported out.

Also disclosed herein are embodiments of a system for modeling integrated circuit (IC) chip performance degradation and predicting IC chip end of life. Specifically, this system can have a memory that stores the results of accelerated stress testing performed in the field on a plurality of IC chips in a given semiconductor technology. These IC chips can be incorporated into a plurality of different types of products (e.g., smart phones, tablet computers, laptop computers, desktop computers, servers, etc.). These IC chips can each be configured with a built-in self-test (BIST) architecture, as described in detail above, capable of subjecting an on-chip test block to accelerated stress testing (i.e., capable of subjecting the on-chip test block to a relatively high operating voltage during a stress mode and performing pass/fail and parametric testing of the test block during a test mode). These IC chips can further be remote access service (RAS) enable so as to allow the results of the accelerated stress testing to be reported out and stored in memory. The system can further comprise one or more system processors in communication with the memory. The system processor(s) can comprise a performance degradation model generator that, based on the results of accelerated stress testing, generates IC chip performance degradation models specific to the different types of products. The system processor(s) can also comprise an end of life prediction generator that generates, based on the results of accelerated stress testing, IC chip end of life predictions specific to the different types of products.

Also disclosed herein are embodiments of an associated method for modeling integrated circuit (IC) chip performance degradation and predicting IC chip end of life. Specifically, this method can comprise accessing, by a system processor from a memory, the results of accelerated stress testing performed in the field on a plurality of IC chips in a given semiconductor technology. These IC chips can be incorporated into a plurality of different types of products (e.g., smart phones, tablet computers, laptop computers, desktop computers, servers, etc.). These IC chips can be configured with a built-in self-test (BIST) architecture, as described in detail above, capable of subjecting an on-chip test block to accelerated stress testing (i.e., capable of subjecting the on-chip test block to a relatively high operating voltage during a stress mode and performing pass/fail and parametric testing of the test block during a test mode). These IC chips can further be remote access service (RAS) enable so as to allow the results of accelerated stress testing to be reported out and stored in memory. The method can further comprise generating, by the system processor based on the results of accelerated stress testing, IC chip performance degradation models and IC chip end of life predictions specific to the different types of products.

Also disclosed herein are embodiments of a computer program product. This computer program product can comprise a computer-readable storage medium that stores a computer-readable program code. The computer-readable program code can comprise instructions that, when executed by a computer, perform a method the above-described method for modeling IC chip performance degradation and predicting IC chip end of life.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
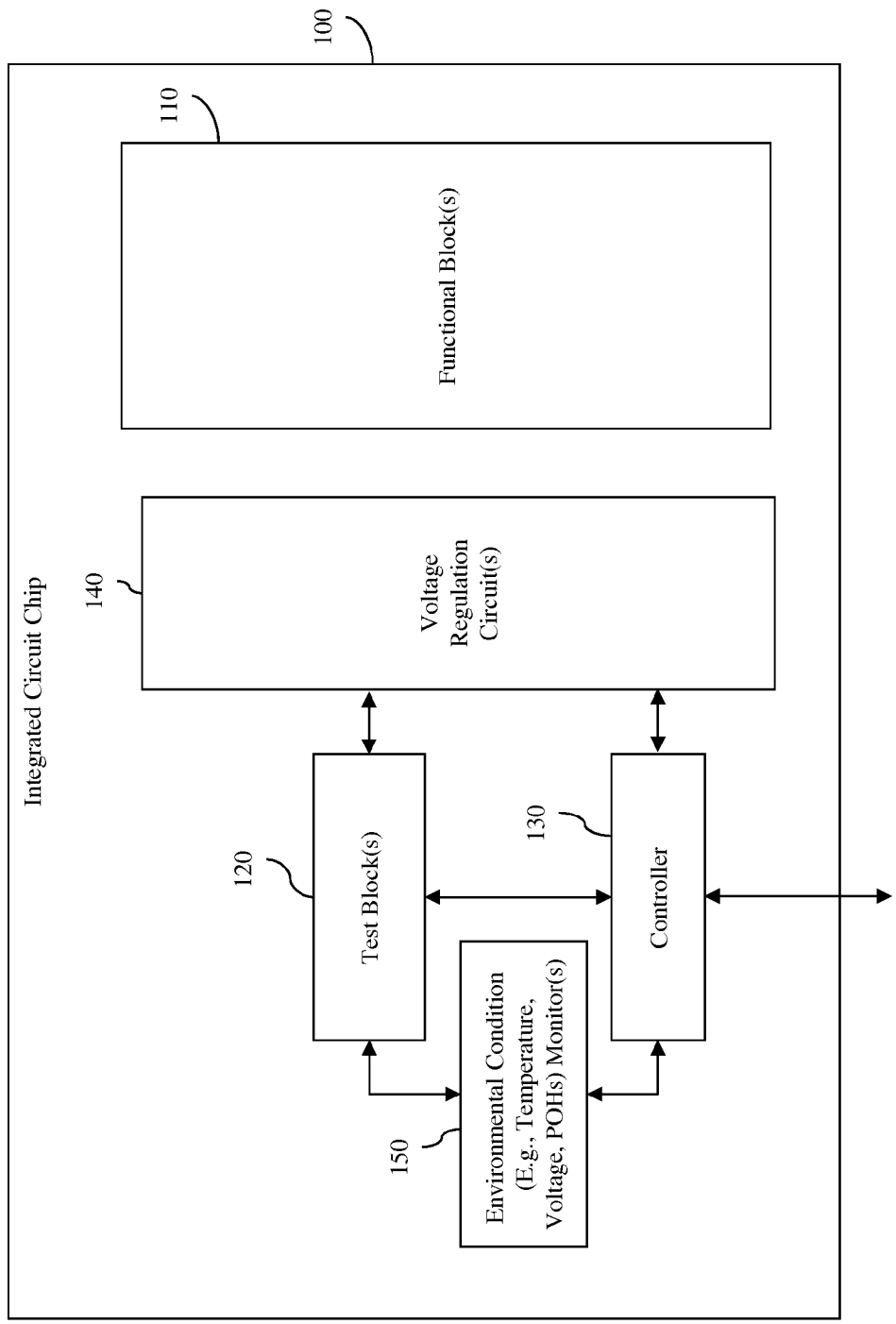
FIG. 1 is a schematic diagram illustrating an embodiment of an integrated circuit (IC) chip with a built-in self-test (BIST) architecture that allows for accelerated stress testing in the filed.

As mentioned above, various mechanisms associated with different classes of devices incorporated into integrated circuit (IC) chips can cause performance of the IC chips to degrade over time. Typically, in order to predict how IC chips in a given semiconductor technology will perform over time, all devices available in that given semiconductor technology are subjected to accelerated voltage and/or temperature stress tests in a laboratory environment at the wafer or module levels and/or in a test system environment. Then, based on the results of the accelerated stress testing, performance degradation models and end of life predictions for the IC chips in the given semiconductor technology are generated. Due to cost and time constraints such IC chip performance degradation models and IC chip end of life predictions are typically generated based on environmental assumptions (e.g., operating temperature, operating voltage, power-on-hours (POH), etc.) associated with only a selected sample of one or more products (e.g., for smart phones, etc.) that incorporate the IC chips. Then, the performance degradation models and end of life predictions are used across all products ((i.e., applied to IC chips in the given semiconductor technology which are incorporated into any other products, such as laptop computers, desktop computers, servers, etc.).

Unfortunately, the environmental assumptions associated with the selected sample of products may be different then the actual environmental conditions in other products. For example, the operating temperature, operating voltage, power-on-hours (POH), etc. of IC chips may vary from product to product. Thus, the resulting IC chip performance degradation models and IC chip end of life predictions may not be applicable across all products. Therefore, it would be advantageous to be able to perform accelerated stress testing of all IC chips in a given semiconductor technology and to do so in the field on different types of products in order to eliminate any inaccurate environmental assumptions, thereby allowing for more accurate and continuously updated IC chip performance degradation models and IC chip end of life predictions that are specific to different types of products.

In view of the foregoing, disclosed herein are embodiments of an integrated circuit (IC) chip structure with a built-in self-test (BIST) architecture that allows accelerated stress testing to be performed in the field in order to provide on-going reliability monitoring while eliminating or at least minimizing any inaccurate environmental assumptions. Specifically, the IC chip can comprise an embedded processor and, specifically, an on-chip BIST controller which selectively alternates operation of an on-chip test block at regular predetermined intervals between a stress mode and a test mode whenever the integrated circuit chip is powered-on such that, during the stress mode, the test block operates at a higher voltage level than an on-chip functional block and such that, during the test mode, the test block operates at a same voltage level as the functional block and is subjected to testing. Also disclosed herein are embodiments of a system, an associated method and a computer program product which access the results of such accelerated stress testing from IC chips in a variety of different types of products in order generate IC chip performance degradation models specific to the different types of products as well as to generate IC chip end of life predictions specific to the different types of products.

More particularly, referring to FIG. 1, disclosed herein are embodiments of an integrated circuit (IC) chip 100 with a built-in self-test (BIST) architecture that allows accelerated stress testing to be performed in the field in order to provide on-going reliability monitoring while eliminating any inaccurate environmental assumptions.

This IC chip 100 can comprise one or more functional blocks, which perform functional operations on the IC chip 100 when incorporated into a product (e.g., a smart phone, a laptop computer, a desktop computer, a server, or any other computerized system). The functional blocks can comprise any one or a combination of the following: a memory array circuit (e.g., an static random access memory (SRAM) array, a dynamic random access memory (DRAM) array, etc.), a digital circuit, an analog circuit, etc.

The IC chip 100 can further comprise one or more test blocks 120 corresponding to the functional block(s) 110. Each test block 120 can comprise a same type circuit as its corresponding functional block 110 (e.g., a memory array circuit, a digital circuit, an analog circuit, etc.) with the same types of devices (e.g., the same types of memory cells, digital devices, or analog devices) configured in essentially the same manner such that they are essentially identical. Optionally, the test block 120 can be smaller than the functional block 110. That is, the test block 120 can comprise a lesser number of the same types of devices as the functional block 110. For example, if the functional block 110 comprises an SRAM array, the test block 120 can similarly comprise an SRAM array but with a lesser number of essentially identical SRAM cells.

The IC chip 100 can further comprise an embedded processor 130 and, specifically, a built-in self-test (BIST) controller operatively connected to the test block 120 and to one or more voltage regulation circuits 140.

The embedded processor 130 can selectively alternate (i.e., can be adapted to selectively alternate, can be configured to selectively alternate, can be programmed to selectively alternate, etc.) operation of the test block 120 between a stress mode and a test mode whenever the integrated circuit (IC) chip 100 is powered-on in the field (i.e., powered-on and functioning with a product). Specifically, when the IC chip 100 is powered on in the field, the embedded processor 130 can immediately cause the test block 120 to operate in a stress mode, as described in greater detail below. Then, at regular pre-determined intervals (e.g., daily, weekly, monthly, etc.), the embedded processor 130 can cause the test block 120 to operate in a test mode for a sufficient amount of time to complete testing, as described in greater detail below. Once testing is complete, the embedded processor 130 can cause operation of the test block 120 to switch back to the stress mode. Thus, the only time the test block 120 does not operate in the stress mode is when it is operating in the test mode.

During the stress mode, the embedded processor 130 can cause the test block 120 to operate at pre-selected higher voltage level than the functional block 110. For example, the nominal operating voltage of the functional block can be 1.0 volts and, during the stress mode, the embedded processor 130 can cause the test block 120 to operate at a pre-selected higher voltage level of, for example, 1.1 volts, 1.2 volts, 1.3 volts, etc. To accomplish this, the embedded processor 130 can cause (i.e., can be adapted to cause, can be configured to cause, can be programmed to cause, etc.) a voltage regulation circuit 140 to apply the pre-selected higher voltage level to the test block 120, when the test block 120 is operating in the stress mode. During the stress mode, the embedded processor 130 can further cause the test block 120 to operate in a manner that mimics the operation of the functional block 110. That is, the embedded processor 130 can apply (i.e., can be adapted to apply, can be configured to apply, can be programmed to apply, etc.) operational test patterns to the test block 120 that correspond to the operational use patterns of the functional block 110.

For example, in one embodiment, the functional block 110 and the test block 120 can each comprise an SRAM array comprising a plurality of SRAM cells. Each memory cell can comprise a static random access memory (SRAM) cell, such as a six transistor (6T) SRAM cell.

Figure 2:
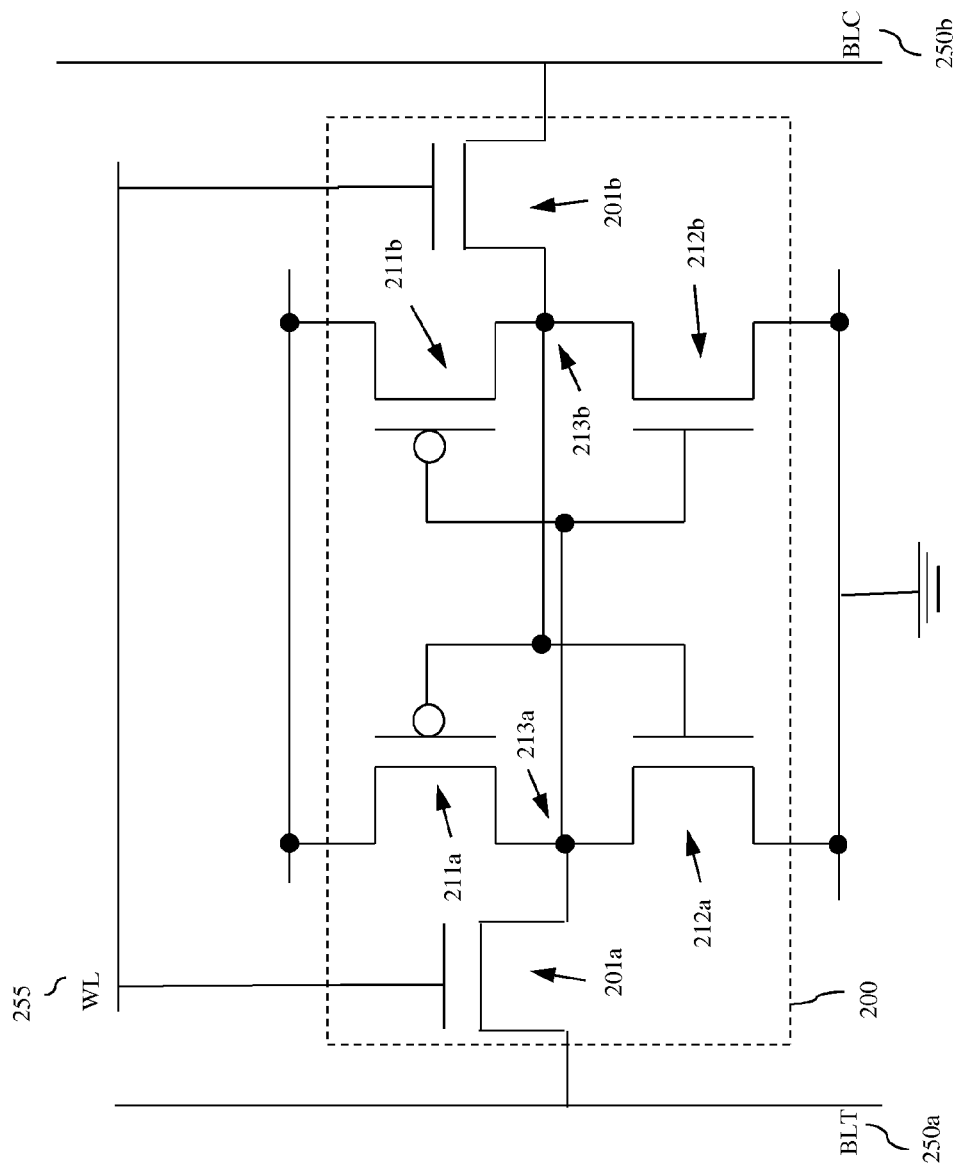
FIG. 2 is a schematic diagram illustrating an exemplary static random access memory (SRAM) cell.

As illustrated in FIG. 2, a 6T SRAM cell 200 typically comprises a pair of access transistors (also referred to as pass-gate transistors) 201a, 201b (e.g., N-type field effect transistors) and a pair of cross-coupled inverters. Each inverter can comprise a pull-up transistor 211a, 211b (e.g., a P-type field effect transistor) connected in series to a pull-down transistor 212a, 212b). The drain of one of the access transistors (e.g., access transistor 201a) of is connected to a node 213a between the pull-up and pull-down transistors 211a and 212a of one of the inverters and the drain of the other access transistor (e.g., access transistor 201b) is connected to a node 213b between the pull-up and pull-down transistors 211b and 212b, respectively, of the other inverter. Furthermore, the source of one of the access transistors (e.g., access transistor 201a) is connected to one bitline of a complementary pair of bitlines (e.g., the bitline 250a, which is also referred to as a true bitline (BLT)) and the source of the other access transistor (e.g., access transistor 201b) is connected the other bitline in the complementary pair of bitlines (e.g., the bitline 250b, also referred to as the complementary bitline (BLC)). The gates of the access transistors 201a, 201b are connected to a wordline (WL) 255.

Each memory cell 200 operates in three different stages: standby, write and read. In the standby state, the cell is idle. In the write stage, a data value is stored in the cell. Specifically, if a data value of "1" (i.e., a high data value) is to be written to the node 213a, a "1" is applied to the bitline 250a and a "0" is applied to the bitline 250b. Then, the wordline 255 is activated to enable the access transistors 201a, 201b and the data value "1" is stored at node 213a. Contrarily, if a data value of "0" (i.e., a low data value) is to be written to the node 213a, a "0" is applied to the bitline 250a and a "1" is applied to the bitline 250b. Then, the wordline 255 is activated to enable the access transistors 201a, 201b and the data value "0" is stored at node 213a. In the reading stage, the data value stored in the cell is read. Specifically, the bitlines 250a, 250b are both pre-charged high (i.e., to a "1") and the wordline 255 is activated to enable the access transistors 201a, 201b. When a data value of "1" is stored on node 213a, bitline 250a will remain charged at its pre-charge level of "1" and the bitline 250b will be discharged to "0" through the transistors 212b and 201b. When a data value of "0" is stored on node 213a, bitline 250a will be discharged to "0" through transistors 212a and 201a and the bitline 250b will remain at is pre-charge level of "1". A sense amplifier (not shown) will sense whether bitline 250a or 250b is higher and, thereby will sense the data value stored in the cell 200.

During stress mode operation of test block 120 comprising an SRAM array, as described above, bitlines will be pre-charged to a predetermined high voltage level that is higher that the voltage level used to pre-charge bitlines of the SRAM cells of a functional block 110 comprising another large SRAM array on the same integrated circuit chip. Furthermore, the various SRAM cells in the test block 120 will be exercised, as described above (i.e., in the standby, write and read stages), at essentially the same frequency as the SRAM cells in the functional block 110 so as to mimic the use conditions of the SRAM cells in the functional block 110.

In another embodiment, during stress mode operation of test block 120 comprising a digital or analog circuit, voltage supply rails will be powered to a predetermined high voltage level that is higher that the voltage level used to power the voltage supply rails of a functional block 110 comprising another large digital or analog circuit on the same integrated circuit chip. Furthermore, the various digital or analog circuits in the test block 120 will be exercised, at essentially the same frequency as the digital or analog circuits in the functional block 110 so as to mimic the use conditions of the digital or analog circuits in the functional block 110.

As mentioned above, at regular pre-determined intervals (e.g., daily, weekly, monthly, etc.), the embedded processor 130 can cause the test block 120 to switch to a test mode. During the test mode, the embedded processor 130 can cause the test block 120 to operate at the same voltage level as the functional block 110. To accomplish this, the embedded processor 130 can cause (i.e., can be adapted to cause, can be configured to cause, can be programmed to cause, etc.)

another voltage regulation circuit to apply the lower voltage level of the functional block 110 to the test block 120 during the test mode. Alternatively, a single voltage regulation circuit 140 can be adapted to output multiple different reference voltages and the embedded processor 130 can cause the single voltage regulation circuit 140 to apply the lower voltage level to the test block 120 during the test mode. Voltage regulation circuits that incorporate, for example, bandgap voltage reference circuits, to generate one or more reference voltages are well known in the art (e.g., see the following U.S. Patents incorporated herein by reference: U.S. Pat. No. 5,666,046 of Mietus, issued on Sep. 9, 1997; U.S. Pat. No. 6,087,820 of Houghton et al. issued on Jul. 11, 2000; and U.S. Pat. No. 7,307,468 of Vasudevan issued on Dec. 11, 2007) and, thus, the details of such circuits are omitted from this specification in order to allow the reader to focus on the salient aspects of the disclosed embodiments.

During the test mode, the embedded processor 130 can further cause the test block 120 to be subjected to testing. Such testing can be divided into two different stages. First, the embedded processor 130 can cause pass/fail testing of the test block 120 to be performed in order to determine the pass/fail status of the test block 120. For a test block comprising a memory array, such testing typically comprises providing a known data input at a known address and comparing the output to the expected output. Second, if the test block 120 passes pass/fail testing, the embedded processor 130 can cause parametric testing to be performed in order to detect and measure any shift in a parameter associated with the test block 120 (i.e., any change in value of the parameter over time, also referred to as drift). The parameter at issue can comprise any electrical parameter identified as having the potential to shift over time and, thereby impact performance. Such electrical parameters can include, but are not limited to, voltage parameters (e.g., minimum operating voltage (Vmin), saturation threshold voltage (Vtsat), linear threshold voltage (Vtlin), etc.), current parameters (e.g., off current (Ioff), on-current (Ion), linear drain current (Idlin), etc.), timing parameters (e.g., maximum frequency (Fmax), switching speed, signal propagation delay, etc.), resistance parameters and capacitance parameters. Various techniques and the corresponding BIST components required for performing such pass/fail and parametric testing for different types of circuits (e.g., memory array circuits, digital circuits, analog circuits, etc.) as controlled by a BIST embedded processor are well known in the art (e.g., see the following U.S. patent documents incorporated herein by reference: U.S. Pat. No. 5,633,877, of Shephard, III et al., issued on May 27, 1997 and U.S. Pat. No. 7,073,112 of Chai et al., issued on Jul. 4, 2006; U.S. Patent Application Publication No. 2008/0100328 of Dhong et al., published on May 1, 2008; etc., see also the following foreign patent documents incorporated herein by reference: DE10110315C2, WO0208904A2 and JP06342040A) and, thus, the details are omitted from this specification in order to allow the reader to focus on the salient aspects of the invention.

The embedded processor 130 can further capture (i.e., can be adapted to capture, can be configured to capture, can be programmed to capture, etc.) the results of such pass/fail and parametric testing and can be remote access service (RAS) enabled so as to allow those results to be reported out (e.g., to a remote access server) for further processing, as discussed in detail below with regard to the method, system, and computer program product embodiments in order to generate a performance degradation model and to generate (i.e., make) an end of life prediction for the IC chip specific to the product.

It should be noted that since accelerated stress testing of the IC chip in this embodiment is performed in the field (i.e., when the IC chip is powered-on and functioning with a product), the performance degradation model and end of life prediction will not be based on inaccurate environmental assumptions applicable to different products. However, for the most accurate performance degradation model and end of life prediction, on-chip environmental conditions can also be tracked and reported out. More specifically, optionally, the IC chip 100 can further comprise one or more environmental condition monitors 150 which track (i.e., which are adapted to track, configured to track, programmed to track, etc.) one or more on-chip environmental conditions, such as actual temperature, actual voltage, and power-on-hours, associated with the test block 120. For purpose of this disclosure the term "track" refers periodically or continuously sense and measure (e.g., in the case of temperature and voltage) or count (e.g., in the case of power on hours). The results of such tracking can be reported out along with the testing results and used to generate (i.e., make) the performance degradation model and end of life prediction.

Figure 3:
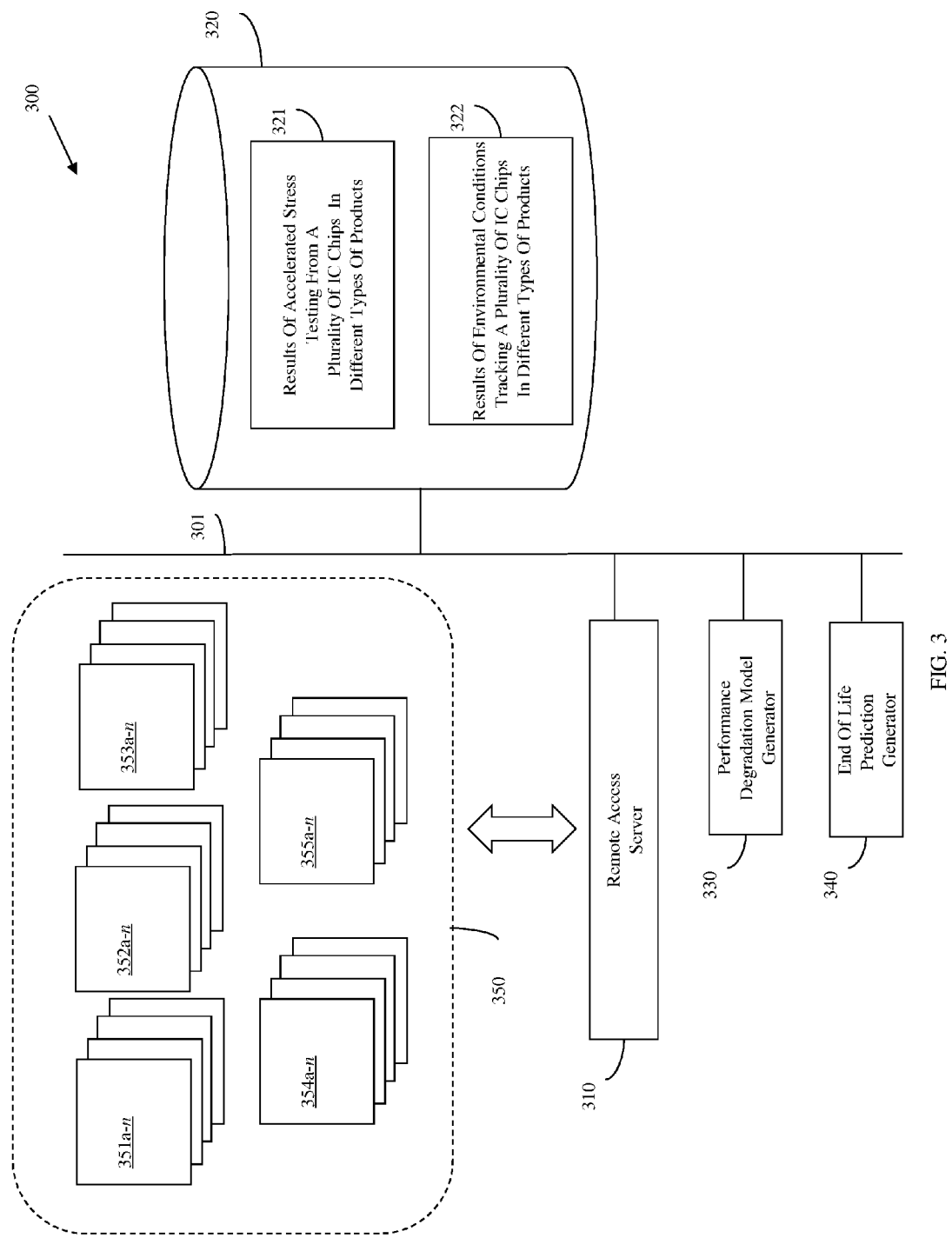
FIG. 3 is a schematic diagram illustrating an embodiment of computer system for modeling integrated circuit (IC) chip performance degradation and predicting IC chip end of life.

Referring to FIG. 3, also disclosed herein are embodiments of a computer system 300 for modeling integrated circuit (IC) chip performance degradation and predicting IC chip end of life. Specifically, this computer system 300 can comprise a remote access server 310, a memory 320 and one or more processor(s) 330, 340, which can communicate (i.e., can be adapted to communication, can be configured to communicate, etc.), for example, over a system bus 301 or other communication means (e.g., a wireless network).

The remote access server 310 can receive and store in memory 320 (i.e., can be adapted to receive and store in memory, can be configured to receive and store in memory, etc.) the results 321 of accelerated stress testing performed in the field on a plurality of IC chips 350, which are incorporated into a plurality of different types of products (e.g., smart phones, tablet computers, laptop computers, desktop computers, servers, etc.)

It should be noted that the IC chips 350 can each be remote access service (RAS) enabled and can comprise a built-in self-test (BIST) architecture that is configured as described in detail above and illustrated in FIG. 1. Specifically, the BIST architecture on each IC chip 350 can be configured to perform accelerated stress testing in the field on an on-chip test block by (1) subjecting the on-chip test block, which corresponds in type to an on-chip functional block, to accelerated stress conditions and, particularly, to a relatively high operating voltage as compared to the operating voltage of the functional block during a stress mode and (2) performing pass/fail and parametric testing of the test block during a test mode to determine the impact of the previously applied accelerated stress conditions. As mentioned above, in this particular BIST architecture, the only time the test block does not operate in the stress mode is when it is operating in the test mode.

As mentioned above, the computer system 300 can further comprise one or more system processor(s) in communication with the memory 320. The system processor(s) can comprise a performance degradation model generator 330 that can access (i.e., can be adapted to access, can be configured to access, can be programmed to access, etc.) the results 321 of accelerated stress testing, which are stored in memory 320. Based on these results 321, the performance degradation model generator 330 can generate (i.e., can be adapted to generate, can be configured to generate, can be programmed to generate, etc.) IC chip performance degradation models specific to the different types of products within which the IC chips 350 are incorporated. The system processor(s) can also comprise an end of life prediction generator 340 that can similarly access (i.e., can be adapted to access, can be configured to access, can be programmed to access, etc.) the results 321 of the on-chip pass/fail and parametric testing, which are stored in memory 320. Based on these results 321, the end of life prediction generator 340 can generate (i.e., can be adapted to generate, can be configured to generate, can be programmed to generate, etc.) IC chip end of life predictions that are specific to the different types of products within which the IC chips 350 are incorporated.

Specifically, given the operating voltage applied to the test blocks of IC chips incorporated into a specific type of product in the stress mode and the measured parametric shifts associated with those test blocks (or, if applicable, the failures associated with those test blocks), the performance degradation model generator 330 can generate a model indicating the expected performance degradation of the functional blocks (i.e., the expected shift in the same parameter in the functional block) of IC chips incorporated into specific types of products. Additionally, based on these same factors, the end of life prediction generator 340 can generate a prediction as to when (e.g., in terms of power on hours) the useful life of the functional blocks on the IC chips incorporated into those specific types of products will end. It should be understood that while the system diagram of FIG. 3 shows the performance degradation model generator 330 and the end of life prediction generator 340 as discrete processing units, these generators 330, 340 can alternatively be integrated into a single processing unit.

Those skilled in the art will recognize that IC chips incorporated into different types of products will be subjected to different environmental conditions (e.g., different temperatures, voltages, power-on-hours, etc.). Therefore, optionally, each IC chip 350 can also be configured with one or more environmental condition monitor(s) that track environmental conditions (e.g., actual voltage, actual temperature and power on hours) associated with the on-chip test block. Additional results 322 of environmental conditions tracking can also be received by the remote access server 310 from the IC chips 350, stored in memory 320 and subsequently used by the performance degradation model generator 330 and end of life prediction generator 340 during performance degradation model and end of life prediction generation. For example, a given IC chip incorporated into a given product may be subjected to an abnormal environmental condition (e.g., an abnormally high operating temperature) due, for example, to a product failure or some user-imposed circumstance. The generators 330, 340 can recognize (i.e., can be adapted to recognize, configured to recognize, etc.) that the environmental condition as abnormal and, therefore, give the results of accelerated stress testing from that given IC chip no weight or less weight when generating the performance degradation model or end of life prediction.

As mentioned above, the results 321 of accelerated stress testing received by the remote access server 310 from the IC chips 350 can cover a variety of different types of products. By using results from IC chips on different types of products and generating product-specific performance degradation models and end of life predictions, the embodiments disclosed herein eliminate or at least minimize the use of inaccurate assumption related environmental conditions.

Optionally, these results 321 can also cover different accelerated stress conditions. That is, some of the IC chips 350 that are incorporated into the same type of product can be subjected to different accelerated stress conditions and, more particularly, different voltage levels during the stress mode. For example, IC chips 350 can comprise multiple sets of IC chips 351a-n, 352a-n, 353a-n, 354a-n, 355a-n, etc., where all the IC chips in a given set are incorporated into a same type of product and where some of the IC chips in each of the sets may be subjected to different accelerated stress conditions. For example, the IC chips 351a-n can be incorporated into a first type of product (e.g., smart phones). The operating voltage of the functional blocks in the IC chips 351a-n can be 1.0 volt. However, the operating voltage of the test blocks in IC chip(s) 351a in the stress mode can be a first voltage (e.g., 1.1 volts), the operating voltage of IC chip(s) 351b in the stress mode can be a second voltage (e.g., 1.2 volts), and so on. Similarly, the IC chips 352a-n can be incorporated into a second type of product (e.g., tablet computers). The operating voltage of the functional blocks in the IC chips 352a-n can be 1.0 volt. However, the operating voltage of test blocks in IC chip(s) 352a in the stress mode can be the first voltage (e.g., 1.1 volts), the operating voltage of IC chip(s) 352b in the stress mode can be the second voltage (e.g., 1.2 volts), and so on. Thus, the results 321 of accelerated stress testing received by the remote access server 310 from the IC chips 350 can cover a variety of different types of products and, optionally, a variety of different accelerated stress conditions.

By using a variety of different accelerated stress conditions, the need for expedited performance degradation models and end of life predictions early on in product life cycles and for more accurate performance degradation models and end of life predictions over the course of product life cycles is met. That is, a relatively high accelerated stress condition (e.g., 1.4 or 1.5 volts) can be used on some IC chips incorporated into a given type of product to expedite the occurrence of parametric shifts and fails in the test blocks of those IC chips so that performance degradation models and end of life predictions can be generated relatively quickly. A relatively low accelerated stress condition (i.e., 1.1 or 1.2 volts) can be used on other IC chips incorporated into that same type of product. Under this relatively low accelerated stress condition, a greater amount of time will be required before parametric shifts and/or fails are realized and performance degradation models and end of life predictions are generated. This greater amount of time ensures that the test blocks are subjected to essentially the same environmental conditions as the functional blocks and over time these environmental conditions may change. Thus, the later generated performance degradation models and end of life predictions will be more accurate and can be used to confirm and/or update the earlier generated performance degradation models and end of life predictions (i.e., to provide on-going reliability monitoring).

Figure 5:
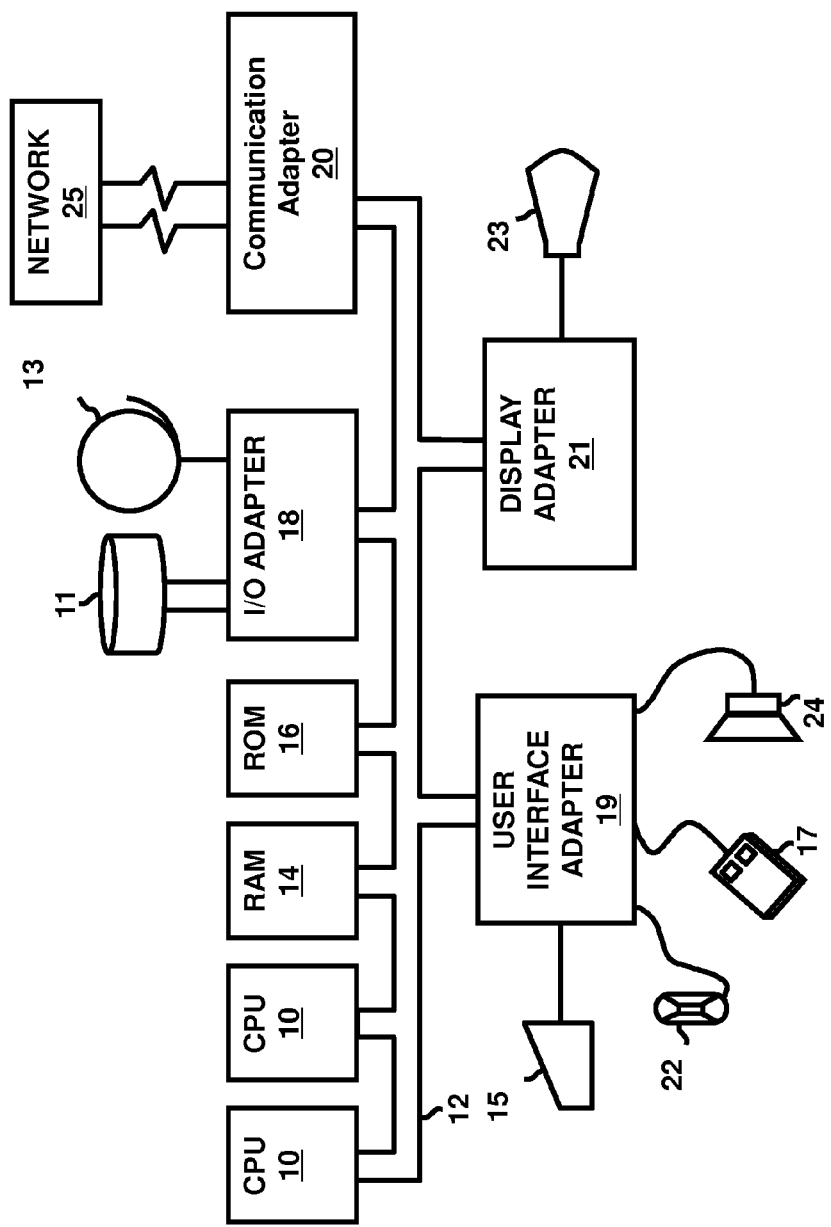
FIG. 5 is a schematic diagram illustrating an exemplary computer hardware environment suitable for implementing the computer system and computer-implemented method embodiments disclosed herein.

It should be understood that the computer system 300 embodiments described above could be implemented, in whole or in part, in a computer hardware environment (e.g., a computer system) such as that described in detail below and depicted in FIG. 5. Alternatively, the computer system 300 embodiments could be implemented on any other computerized device (e.g., a laptop computer, tablet computer, handheld device, smart phone, etc.) having the required remote communication, data storage and processing capability to perform the described processes.

Figure 4:
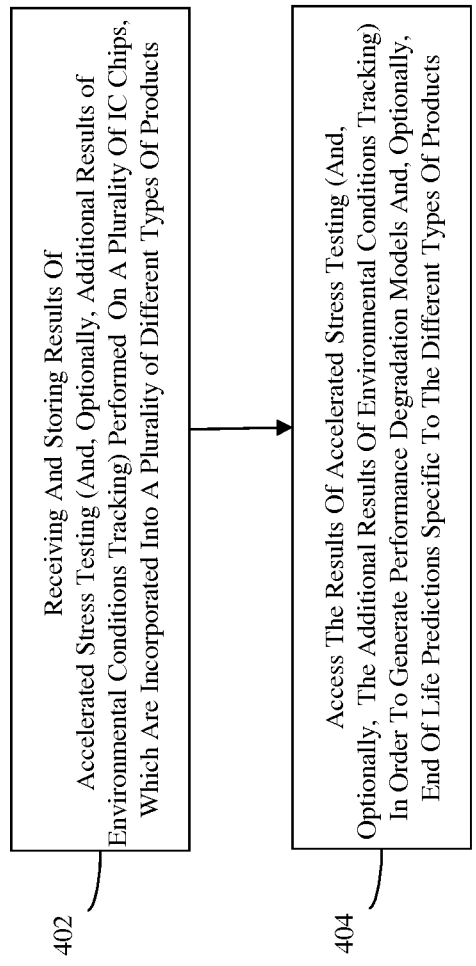
FIG. 4 is a flow diagram illustrating an embodiment of a computer-implemented method for modeling integrated circuit (IC) chip performance degradation and predicting IC chip end of life.

Referring to FIG. 4 in combination with FIG. 3, also disclosed herein are embodiments of a computer-implemented method for modeling integrated circuit (IC) chip performance degradation and predicting IC chip end of life. Specifically, this method can comprise receiving (e.g., by a remote access server 310) and storing in memory 320 the results 321 of accelerated stress testing performed in the field on a plurality of IC chips 350 (402). These IC chips 350 can be incorporated into a plurality of different types of products, such as smart phones, tablet computers, laptop computers, desktop computers, servers, etc., and can be configured with a BIST architecture as described in detail above and illustrated in FIG. 1.

The method can further comprise accessing (e.g., by a system processor and, particularly, a performance degradation model generator 330) the results 321 of accelerated stress testing, which have been stored in memory 320 and, based on these results 321, generating IC chip performance degradation models specific to the different types of products within which the IC chips 350 are incorporated (404). Optionally, process 404 can further comprise accessing (e.g., by a system processor and, particularly, an end of life prediction generator 340) the same results 321 and, based on these results 321, also generating IC chip end of life predictions specific to the different types of products within which the IC chips 350 are incorporated.

Specifically, at process 404, given the operating voltage applied to the test blocks of IC chips incorporated into a specific type of product in the stress mode and the measured parametric shifts associated with those test blocks (or, if applicable, the failures associated with those test blocks), a model indicating the expected performance degradation of the functional blocks (i.e., the expected shift in the same parameter in the functional block) of IC chips incorporated into specific types of products can be generated. Additionally, based on these same factors, a prediction as to when (e.g., in terms of power on hours) the useful life of the functional blocks on the IC chips incorporated into those specific types of products will end can be generated.

Those skilled in the art will recognize that IC chips incorporated into different types of products will be subjected to different environmental conditions (e.g., different temperatures, voltages, power-on-hours, etc.). Therefore, optionally, each IC chip 350 can also be configured with one or more environmental condition monitor(s) that track environmental conditions (e.g., actual voltage, actual temperature and power on hours) associated with the on-chip test block. In this case, additional results 322 of environmental conditions tracking can also be received (e.g., by the remote access server 310 from the IC chips 350) and stored in memory 320 at process 402 and subsequently used for performance degradation model and end of life prediction generation at process 404.

As discussed in detail above, the results 321 of accelerated stress testing used at process 404 can cover a variety of different products and a variety of different accelerated stress conditions. By using results from IC chips on different types of products and generating product-specific performance degradation models and end of life predictions, the embodiments disclosed herein eliminate or at least minimize the use of inaccurate assumption related environmental conditions. Furthermore, by optionally using a variety of different accelerated stress conditions, the need for expedited performance degradation models and end of life predictions early on in product life cycles and for more accurate performance degradation models and end of life predictions over the course of product life cycles (i.e., on-going reliability monitoring) is met.

Also disclosed herein are embodiments of a computer program product. The computer program product can comprise a program storage device readable by a computer and tangibly embodying a program of instructions that is executable by the computer to perform any of the above-described computer-implemented method for modeling integrated circuit (IC) chip performance degradation. More particularly, as will be appreciated by one skilled in the art, aspects of disclosed embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the disclosed embodiments may take the form of a computer program product embodied in one or more computer readable medium(s) having computer readable program code embodied thereon.

Any combination of one or more computer readable medium(s) may be utilized. The computer readable medium may be a non-transitory computer readable storage medium or computer readable signal medium. A computer readable storage medium may be, for example, but is not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the disclosed embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the disclosed embodiments are described above with reference to flowchart illustrations and/or block diagrams of methods, apparatus (systems) and computer program products. It will be understood that each block of the flowchart illustrations and/or D-2 block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A representative hardware environment for practicing the system, method and computer program product embodiments discussed above is depicted in FIG. 5. This schematic drawing illustrates a hardware configuration of an information handling/computer system in accordance with the embodiments. The system comprises at least one system processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the flowchart and block diagrams in the Figures illustrate the architecture, functionality, and operation of possible implementations of systems, methods and computer program products according to various embodiments disclosed herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should further be understood that the terminology used herein is for the purpose of describing particular embodiments only and is not intended to be limiting. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The above-description has been presented for purposes of illustration, but is not intended to be exhaustive or limiting. Many modifications and variations will be apparent to those of ordinary skill in the art without departing from the scope and spirit of the disclosed embodiments.

Therefore, disclosed above are embodiments of an integrated circuit (IC) chip structure with a built-in self-test (BIST) architecture that allows accelerated stress testing to be performed in the field in order to provide on-going reliability monitoring while eliminating or at least minimizing any inaccurate environmental assumptions. Specifically, the IC chip can comprise an embedded processor and, specifically, an on-chip BIST controller which selectively alternates operation of an on-chip test block at regular predetermined intervals between a stress mode and a test mode whenever the integrated circuit chip is powered-on such that, during the stress mode, the test block operates at a higher voltage level than an on-chip functional block and such that, during the test mode, the test block operates at a same voltage level as the functional block and is subjected to testing. Also disclosed herein are embodiments of a system, an associated method and a computer program product which access the results of such accelerated stress testing from IC chips in a variety of different types of products in order generate IC chip performance degradation models specific to the different types of products as well as to generate IC chip end of life predictions specific to the different types of products. Thus, the embodiments allow for on-going product-specific IC chip reliability monitoring in the field, making the costly and time consuming on-going reliability monitoring that occurs at the wafer and/or module levels optional.

What is claimed is:

1. An integrated circuit chip comprising:
   a functional block comprising a first memory array comprising first bitlines;
   a test block comprising a second memory array comprising second bitlines, the first memory array and the second memory array being a same type memory array; and
   an embedded processor selectively alternating operation of said test block between a stress mode and a test mode during functioning of said integrated circuit chip within a product,
   said embedded processor performing said selectively alternating of said operation of said test block between said stress mode and said test mode when said integrated circuit chip is powered-on within said product,
   said first bitlines being pre-charged at a nominal operating voltage during said operation of said test block in said stress mode and said test mode,
   said embedded processor causing said second bitlines to be pre-charged at a higher voltage level than said nominal operating voltage during said stress mode, said embedded processor causing said second bitlines to be pre-charged at a same voltage level as said nominal operating voltage and to be subjected to testing during said test mode, and said embedded processor further being remote access service (RAS) enabled so as to allow results of said testing to be reported out during said functioning of said integrated circuit chip.

2. The integrated circuit chip of claim 1, said functional block and said test block each comprising a static random access memory (SRAM) array.

3. The integrated circuit chip of claim 1, said test block comprising a lesser number of devices than said functional block.

4. The integrated circuit chip of claim 1, said testing comprising:
performing pass/fail testing to determine a pass/fail status of said test block; and
performing parametric testing to detect and measure any shift in a parameter associated with said test block.

5. The integrated circuit chip of claim 1, said embedded processor further performing said selectively alternating of said operation of said test block between said stress mode and said test mode such that said testing is performed at regular predetermined intervals.

6. The integrated circuit chip of claim 1, further comprising a monitor tracking environmental conditions associated with said test block.

7. An integrated circuit chip comprising:
a functional block comprising a first memory array comprising first bitlines;
a test block comprising a second memory array comprising second bitlines, the first memory array and the second memory array being a same type memory array;
a monitor tracking environmental conditions associated with said test block; and
an embedded processor in communication with said test block and said monitor,
said embedded processor selectively alternating operation of said test block between a stress mode and a test mode during functioning of said integrated circuit chip within a product,
said embedded processor performing said selectively alternating of said operation of said test block between said stress mode and said test mode when said integrated circuit chip is powered-on within said product,
said first bitlines being pre-charged at a nominal operating voltage during said operation of said test block in said stress mode and said test mode,
said embedded processor causing said second bit lines to be pre-charged at a higher voltage level than said nominal operating voltage during said stress mode,
said embedded processor causing said second bitlines to be pre-charged at a same voltage level as said nominal operating voltage and to be subjected to testing during said test mode, and
said embedded processor further being remote access service (RAS) enabled so as to allow results of said testing and said tracking be reported out during said functioning of said integrated circuit chip.

8. The integrated circuit chip of claim 7, said functional block and said test block each comprising a static random access memory (SRAM) array.

9. The integrated circuit chip of claim 7, said test block comprising a lesser number of devices than said functional block.

10. The integrated circuit chip of claim 7, said testing comprising:
performing pass/fail testing to determine a pass/fail status of said test block; and
performing parametric testing to detect and measure any shift in a parameter associated with said test block.

11. The integrated circuit chip of claim 7, said embedded processor further performing said selectively alternating of said operation of said test block between said stress mode and said test mode such that said testing is performed at regular predetermined intervals.

12. The integrated circuit chip of claim 11, said regular predetermined intervals being any one of daily, weekly and monthly.

13. An integrated circuit chip comprising:
a functional block comprising a first static random access memory (SRAM) array comprising first static random access memory (SRAM) cells and first bitlines;
a test block comprising a second static random access memory (SRAM) array comprising second static random access memory (SRAM) cells and second bitlines; and
an embedded processor selectively alternating operation of said test block between a stress mode and a test mode during functioning of said integrated circuit chip within a product,
said first bitlines being pre-charged to a nominal operating voltage during memory operations are performed by said functional block and regardless of whether said operation of said test block is in said stress mode or said test mode,
said embedded processor performing said selectively alternating of said operation of said test block between said stress mode and said test mode when said integrated circuit chip is powered-on within said product,
said embedded processor causing said first static random access memory (SRAM) cells and said second static random access memory (SRAM) array to be exercised at a same frequency during said stress mode,
said embedded processor causing said second bitlines to be pre-charged at a higher voltage level than said nominal operating voltage of said first bitlines during said stress mode,
said embedded processor causing said second bitlines to be pre-charged to a same voltage level as said nominal operating voltage of said first bitlines and to be subjected to testing during said test mode; and
said embedded processor further being remote access service (RAS) enabled so as to allow results of said testing to be reported out during said functioning of said integrated circuit chip.

14. The integrated circuit chip of claim 13, said first static random access memory (SRAM) array having a first number of said first static random access memory (SRAM) cells, said second static random access memory (SRAM) array having a second number of said second static random access memory (SRAM) cells, said first number being greater than said second number.

15. The integrated circuit chip of claim 13, said testing comprising:
performing pass/fail testing to determine a pass/fail status of said test block; and
performing parametric testing to detect and measure any shift in a parameter associated with said test block.

16. The integrated circuit chip of claim 13, said embedded processor selectively alternating said operation of said test block between said stress mode and said test mode such that said testing is performed at regular predetermined intervals.

17. The integrated circuit chip of claim 13, further comprising a monitor tracking environmental conditions associated with said test block.

18. The integrated circuit chip of claim 17, said embedded processor being remote access service (RAS) enabled so as to also allow results of said tracking be reported out.

* * * * *